United States Patent [19]

Ready

[11] 4,204,165
[45] May 20, 1980

[54] MULTICHANNEL COHERENT RECEIVER

[75] Inventor: Patrick J. Ready, Woodland Hills, Calif.

[73] Assignee: Typoligics, Inc.

[21] Appl. No.: 901,328

[22] Filed: May 1, 1978

[51] Int. Cl.² ............................................ H04B 17/00
[52] U.S. Cl. .................................. 455/226; 324/77 B; 343/5 SA
[58] Field of Search .................. 325/65, 344, 334–337, 325/363, 430–434; 343/5 SA; 324/77 B, 77 CS; 179/15.55 T, 15 AC

[56] References Cited

U.S. PATENT DOCUMENTS

| | | | |
|---|---|---|---|
| 2,954,465 | 9/1960 | White | 325/336 |
| 3,729,738 | 4/1973 | Cross et al. | 324/77 CS |
| 3,879,661 | 4/1975 | Collins | 324/77 B |
| 3,955,137 | 3/1976 | Harrington et al. | 324/77 B |
| 4,005,417 | 1/1977 | Collins | 343/5 SA |
| 4,131,852 | 12/1978 | Holland-Moritz | 325/363 |

OTHER PUBLICATIONS

J. B. Harrington et al., "Compressive Intercept Receiver Using SAW Devices", Microwave Journal, 17,9, pp. 57–62, 1974.
R. M. Hays et al., "Surface Wave Transform Adaptable Processor System", Ultrasonic Symposium Proc., IEEE, Cat. No. 75, CHO 994–4SU, 1975.
J. D. Maines et al., "A Novel SAW Variable-Frequency Filter", Ultrasonic Symposium Proc., IEEE, Cat. No. 75, CHO 994–4SU, 1975.
J. M. Alsup, "Surface Acoustic Wave CZT Processors", Ultrasonic Symposium Proc., IEEE, Cat. No. 74, CHO 896–1SU, 1974.
G. R. Nudd et al., "Chirp Signal Processing Using Acoustic Surface Wave Filters", Ultrasonic Symposium Proc., IEEE, Cat. No. 75, CHO 994–4SU, 1975.

*Primary Examiner*—John C. Martin
*Assistant Examiner*—Jin F. Ng
*Attorney, Agent, or Firm*—John E. Wagner

[57] ABSTRACT

A multichannel coherent receiver employing multiple delay lines in series or a tapped delay line into which a received signal band is introduced. The signal band at each tap or increment of delay is mixed with individual related frequencies and the product from the mixers summed and further mixed with the output of a swept oscillator. The composite delayed signal band is introduced into a bank of dispersive filters followed by means for deriving in-phase and quadrature components. Signals contained within the signal band may then be detected resulting in coherent channelization, improved frequency resolution and full time coverage sampling.

21 Claims, 17 Drawing Figures

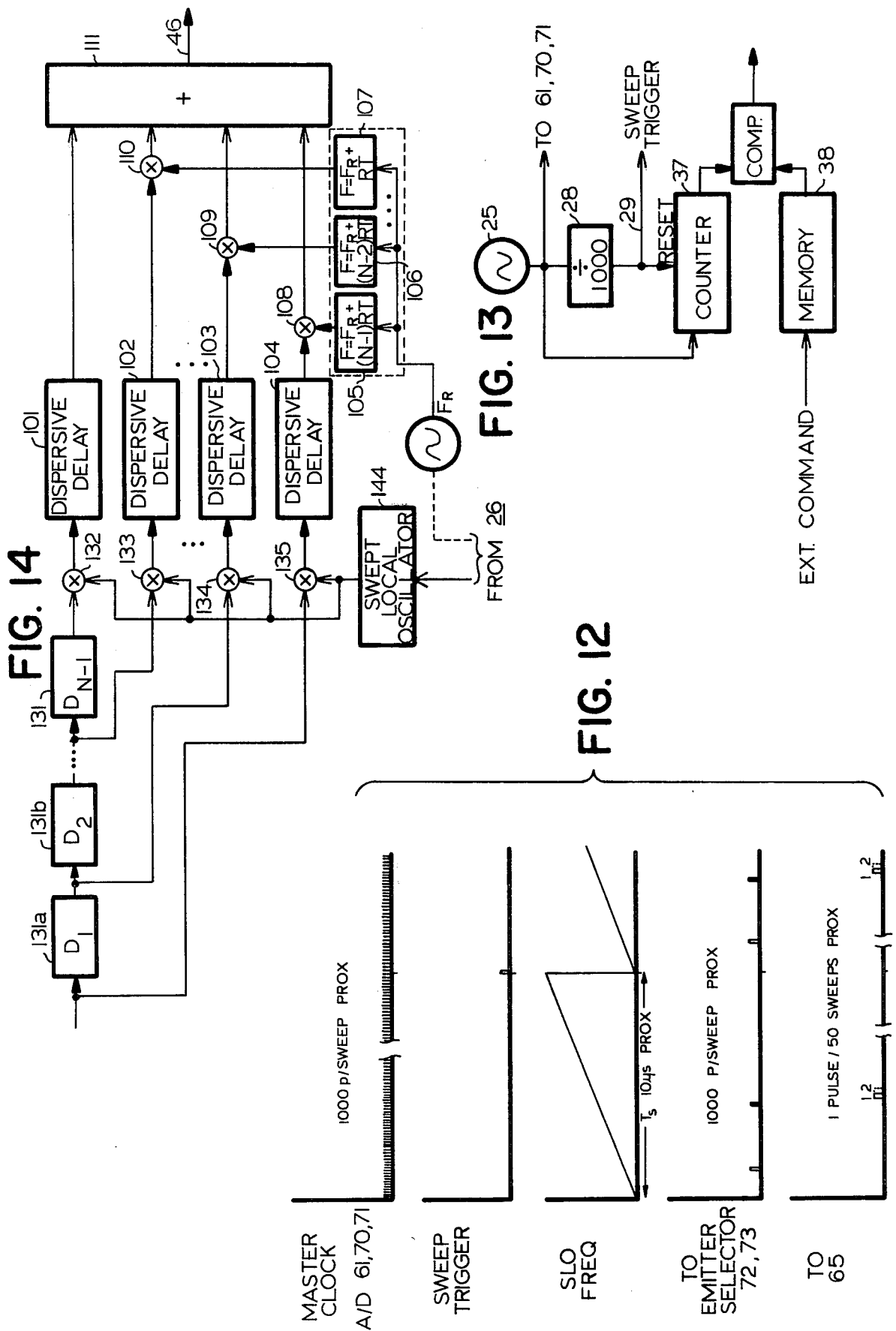

MULTICHANNEL COHERENT RECEIVER

BACKGROUND OF THE INVENTION

There has long been a need for new receivers designed to monitor a selected frequency band, simultaneously perform spectral analysis of multiple signals appearing at unpredictable frequencies in the band and simultaneously coherently extract the multiple signals. A receiver which performs the first function, spectral analysis, is the compressive or microscan receiver. Such receivers are best described in the publications:

1. H. M. Gerard, O. W. Otto, "Chirp Transform Opens New Processing Possibilities", Microwave System News, pp. 85-92, October, 1977.
2. J. B. Harrington, R. B. Nelson, "Compressive Intercept Receiver Uses SAW Devices," Microwave Journal, pp. 57-62, 1974.

Suffice it to say, conventional compressive receivers form the analog Fourier transform of their input, with both amplitude and phase preserved prior to envelope detection. This transform is produced once per scan period ($T_S$) with a frequency resolution approximately $1/T$ Hz, where T is the length of time a pure tone at the receiver input is visible to the compression filter. For conventional receivers $T_S > T$.

Typically, the fraction of sweep time ($T_S$) that a signal is visible to its compression filter termed probability of intercept (POI) or duty cycle for a conventional compression receiver is 0.5 or 50%. Only in limiting cases where the input bandwidth approaches 0 Hz or the scan rate R becomes infinite does the POI approach 1 or 100%. The end result has been that conventional receivers necessarily have scan rates which are too slow relative to the Nyquist criteria and channelization of signals is therefore prohibited.

A somewhat different approach has been taken by certain researchers employing conventional compression receivers in which the compression filter bandwidth and dispersion are twice that of the swept oscillator.

Such a configuration approaches minimum Nyquist sampling since $T \simeq T_s$. However, each output pulse is located at a different intermediate frequency, corresponding to its initial location within the input bandwidth. Thus, side-lobe supression in this system cannot be achieved by a passive IF filter, and the noise bandwidth is twice that required for the same resolution in the previous configuration. Additionally, simultaneous channelization of signals of interest (SOI) is not possible due to the random IF's.

As a final comment on the prior art, we note that it is not unusual to find a signal of interest in close frequency proximity to an unwanted strong emmiter. Under these conditions, it is very likely that energy from this strong signal will be significant within the channelization filter centered on the signal of interest. Thus, in practical situations, it is important to have the receiver sampling rate significantly above Nyquist (say twice) to avoid folding the strong emmiter directly onto the signals of interest. In systems of this type, replicating the receiver to provide parallel, time-sequential channels is required. This is a costly approach in terms of both hardware and the degree to which the multiple receivers must be matched.

BRIEF DESCRIPTION OF THE INVENTION

I have developed a new receiver which:

(1) Provides instantaneous coherent extraction of signals of interest (SOI) located at arbitrary frequencies within a selected intercept band at or above the Nyquist rate;

(2) Provides one hundred percent or greater (window overlap) time coverage of the intercept spectrum;

(3) Provides a factor of $$\frac{K(K - F_s)}{1 - F_s}$$

times improvement in:

(a) Increased intercept bandwidth for the same resolution and dispersive filter time-bandwidth product;

(b) Increased frequency resolution for the same intercept bandwidth and dispersive filter time-bandwidth product;

(c) Reduced dispersive filter time-bandwidth product for the same resolution and intercept bandwith. A typical conventional microscan receiver has $K=1$, and $F_s=0.5$. Thus, the improvement factor is 28 with my invention configured with $K=4$.

(4) Accomplishes simultaneously both spectral analysis and channelization with the same receiver for reduced equipment requirements;

(5) Instantaneously and automatically synthesizes band pass filters at arbitrary frequencies permitting extraction of SOI, and detection of short burst and frequency agile signals.

Briefly, my invention involves the combination of means for properly-delaying and frequency-multiplexing time segments of the intercept bandwidth coupled to a mixer in which the entire frequency multiplexed signal is swept in frequency by a swept local oscillator. These frequency swept bands are introduced into a bank of frequency-dependent delay lines whereby a plurality (K) of the chirped time segments are simultaneously filtered. These signals are then coherently summed in an adder and thereafter introduced into an in-phase and quadrature mixer/sampler combination. The sampler is activated once per sweep of the local oscillator for each desired signal of interest.

In accordance with the method of this invention incoming signals are delayed and frequency multiplexed in to a plurality of frequency bands, chirped or frequency swept, delayed in each band as a function of frequency, next coherently summed and then sampled to provide coherent channelization and improved frequency resolution.

BRIEF DESCRIPTION OF THE DRAWINGS

This invention may be more clearly understood from the following detailed description and by reference to the drawings in which:

FIG. 12 is a timing diagram of the embodiment of FIG. 4;

FIG. 13 is a block diagram of the timing signal source of FIG. 4;

FIG. 14 is a block diagram of an alternate embodiment of this invention; and

DETAILED DESCRIPTION OF THE INVENTION

As prelude to an understanding of this invention, a description and analysis of the operation of a conventional compressive receiver is believed desirable.

Figure 1:
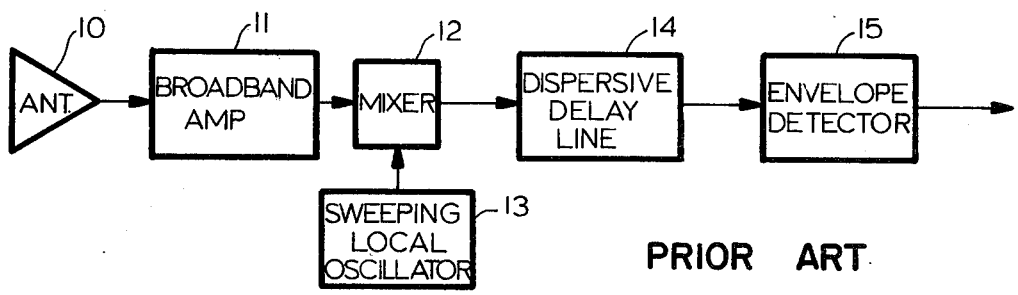
FIG. 1 is a block diagram of prior art receivers.
Figure 2:
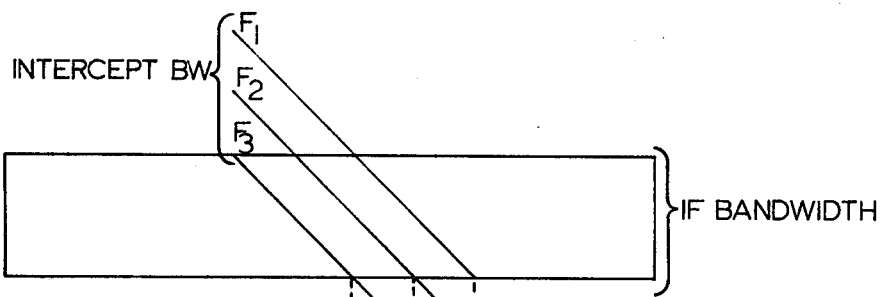
FIGS. 2 and 3 are graphical representations of the operating characteristics of prior art receivers.

FIG. 1 shows a conventional compressive receiver in simplified block diagram form. It comprises basically a signal source represented by an antenna 10 coupled to a broadband amplifier 11 covering the frequency spectrum of interest. The amplified signal or signals from the amplifier 11 is mixed in mixer 12 with the output of a swept or chirped local oscillator 13. The converted output of the mixer 12 is introduced into a dispersive delay line or filter 14 which serves to delay in time each signal appearing at the input an amount varying with the input center frequency. Next, the delayed composite signals are envelope detected in detector 15. The graphical representation of this operation appears in FIG. 2.

Analytically, receivers of the type shown in FIG. 1, commonly called pulse compression or microscan receivers, perform a Fourier transformation of the input signal. Using complex notation to simplify the analysis, we express the output of the mixer 12 as $$y(t) = s(t)e^{j(\omega_o t - \pi R t^2)} |t| \leq T/2 \qquad (1)$$

where s(t) is the signal under analysis, $\omega_o$ is the dispersive delay line 14 center frequency, and R is the swept oscillator 13 scan rate in Hz/sec. The dispersive delay line 14 is matched to the chirped signal in that its impulse response is $$h(t) = e^{j(\omega_o t + \pi R t^2)} \qquad (2)$$

Thus, the filter 14 output is $$y'(\tau) = \int_{-T/2}^{T/2} s(t)e^{j(\omega_o t - \pi R t^2)}e^{j(\omega_o(\tau - t) + \pi R(\tau - t)^2)}dt. \qquad (3)$$

Using the window function w(t) the square term, equation (3) becomes $$y'(\tau) = e^{j(\omega_o \tau + \pi R \tau^2)} \int_{-\infty}^{\infty} w(t)s(t)e^{-j2\pi R\tau t}dt. \qquad (4)$$

where $w(t) \neq 0$ for $|t| \leq T/2$ and $w(t) = 0$ where $|t| > T/2$.

The integral in equation (4) is the Fourier transform of w(t)s(t) with R as the frequency variable. For large time-bandwidth products (TW>100) the residual FM (or chirp) term may sometimes be ignored as discussed below in the description of my Multichannel Coherent Receiver.

The resolution of the above transform is determined by the duration of the window function w(t). This is because the transform of w(t)s(t) is the convolution of the individual transforms, and $$\int_{-T/2}^{T/2} w(t) \exp(-j2\pi R\tau t)dt = \frac{\sin(\pi R\tau T)}{\pi R\tau} \qquad (5)$$

has an approximate bandwidth of 1/T Hz

Converting equation (4) to magnitude and phase notation gives $$\exp(j\omega_o \tau + j\pi R\tau^2) \int_{-\infty}^{\infty} w(t)s(t) \exp(-j2\pi R\tau) dt \stackrel{\Delta}{=} \qquad (6)$$
$$A(2\pi R\tau) \exp(j\phi(2\pi R\tau) + j\omega_o \tau + j\pi R\tau^2)$$

The output of the envelope detector 15 in FIG. 1 is then $A(2\pi R\tau)$, the magnitude of the desired Fourier transform.

The above process is repeated for each sweep of the local oscillator 13 and the result is a transform every $T_s$ seconds.

POI Considerations

Figure 3:
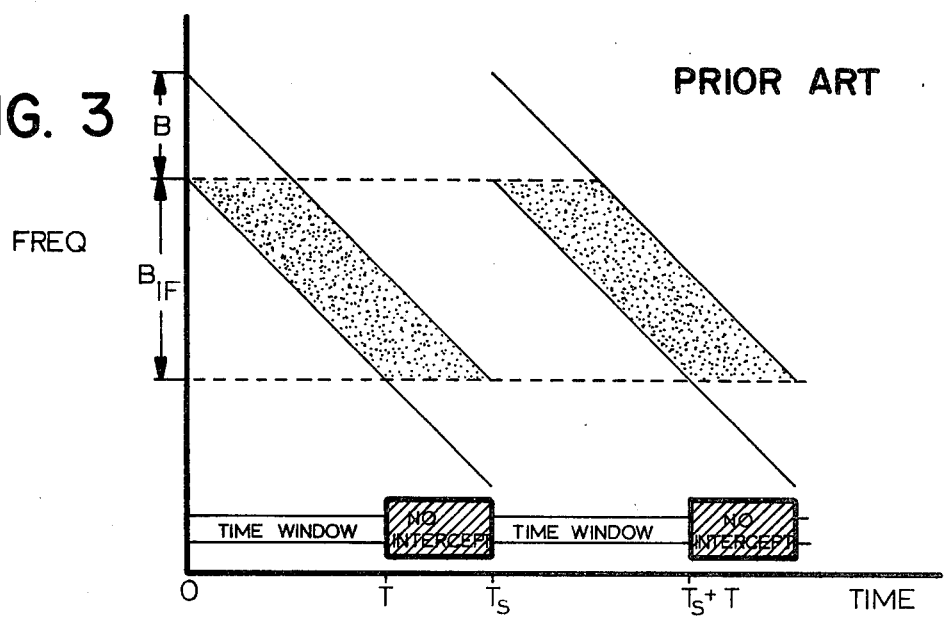

An expanded frequency versus time plot for the conventional compressive receiver shown in FIG. 1 is presented in FIG. 3. The input bandwidth is indicated by B, and the dispersive matched filter 14 bandwidth by $B_{IF}$. The grey area in each sweep is the region in time and frequency during which the chirped input is visible to the matched filter 14.

Although the IF bandwidth at the output of mixer 12 may in general be greater than or less than that indicated in FIG. 3, the IF as shown results in the maximum resolution for a given scan time (consistent with uniform resolution across the input band and maximum receiver sensitivity) possible for conventional receivers.

As indicated by the NO INTERCEPT region at the bottom of FIG. 3, signals occupying the lower frequencies in the input bandwidth fall out of the IF window after T seconds. Similar regions exist for all signals within the input band, as may be seen from FIG. 3.

Ignoring signal to noise ratio considerations, POI is usually defined as the fraction of sweep time, $T_s$ that a signal is visible to the compressive filter 14. Thus, $$POI = T/T_s. \qquad (7)$$

Typically, $T = (1/2)T_s$ and POI = 0.5. Only in the limit, as the input bandwidth approaches 0 Hz, or the scan rate R becomes infinite, does the conventional compressive receiver as defined above achieve 100 percent POI.

The POI problem is also directly related to the resolution-revisit time difficulty. In order to sweep the entire input bandwidth through the IF window, the receiver must ensure $T_s < T + B/R$. This conflicts with a revisit time $T_s < T$ commensurate with the resolution (or channelization filter bandwidth) 1/T Hz. The time B/R sec. is the minimum required overhead. Thus, the conventional receiver is too slow relative to the Nyquist rate by B/R seconds.

MY MULTICHANNEL COHERENT RECEIVER

The problems of sampling rate and POI of the conventional receivers are solved employing my receiver design which is capable of both channelization and improved frequency resolution. My basic circuit design appears in FIG. 4. It employs a signal source represented as antenna 20 which feeds a first band pass filter 21 either directly or through an RF amplifier, unshown, and a gain control circuit 22 to a mixer 23 where mixer 23 combines the incoming broad band signal from antenna 20 with a local oscillator frequency $F_1$ from an oscillator or frequency synthesizer 24, which may be free running or synchronized by a master clock 25 which is a part of a timing and control circuit generally designated 26. This possible synchronization input is indicated by a dash-dot line.

The output of the mixer 23 is an intermediate frequency band containing a replica of the input band from band pass filter 21 I.F. converted. After filtering in second band pass filter to eliminate all but the IF band, the converted signal is introduced into a series of delay lines or a single tapped delay line 31 having $K-1$ sections $D_1 - - - D_{K-1}$, each of T seconds delay and $K-1$ taps designated as 32, 33 - - - $K-1$, where K equals the number of multiplexed time windows desired. The frequency multiplexed delay circuit 31 also includes a number of oscillators 37,38 - - - $O_{K-1}$ separated in frequency by (RT)Hz generating frequencies $F=F_R+(K-1)RT$ - - - $(K-1)RT$ along with their associated mixers 34, 35 - - - $M_{K-1}$ to up convert the respective delayed IF signals by RT Hz as RT is later defined.

The frequencies $F=F_R+(K-1)RT$ - - - $F=F_R+RT$ generated by local oscillators 37,38 - - - $O_{K-1}$ may each be generated simply by mixing the output frequency of additional local oscillators $(K-1)RT$ - - - RT with the reference frequency $F_R$.

The up converted delayed signals are each summed with the succeeding signal in respective summers 40 and 41 while the output of the delay stage $D_{K-1}$ without up conversion is summed with the output of summer 41 in summer 42. The output of summer 42 is in turn mixed in mixer 43 with the output of a variable frequency or swept local oscillator 44. The nature of the signal output of mixer 43 is best described below in the section, Multiplexed Time Delay Subsystem.

Figure 6:
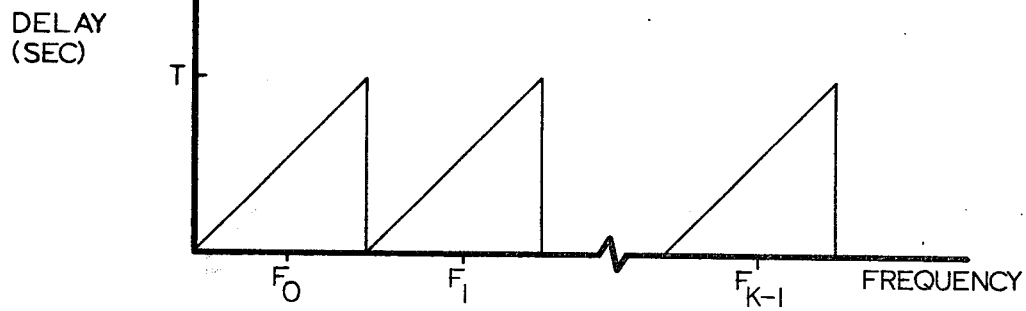
Figure 7:
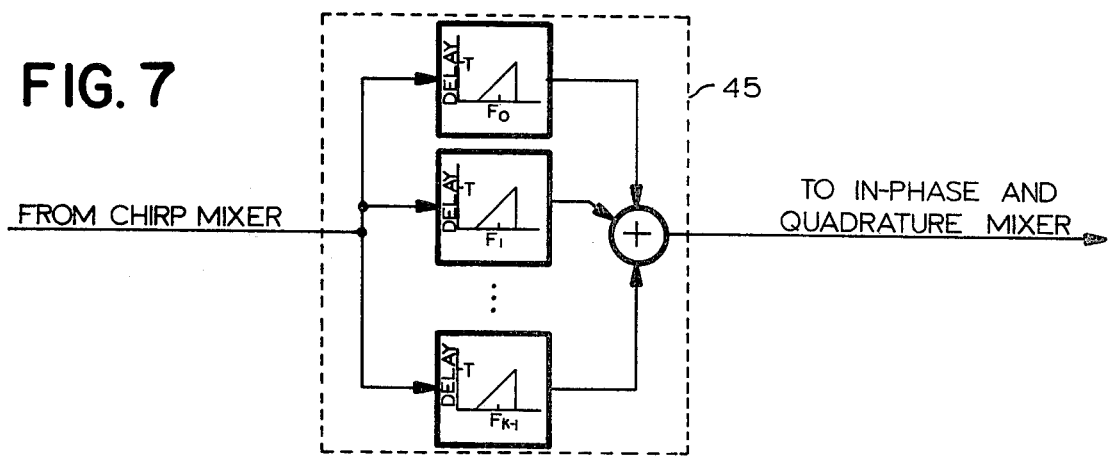
FIG. 7 is a block diagram of one embodiment of multiplexed compression filters employed in this invention.

Suffice it to say, the frequency multiplexed and delayed signal is introduced into a matched multiplexed compression filter 45 having a characteristic as shown in FIG. 6 and having one embodiment illustrated in FIG. 7. This matched compression filter produces at its output, as described below, the Fourier transform of the receiver input signal band having a true time window of KT second duration. This output on lead 46 is into a conventional in phase and quadrature sampler including mixers 50 and 51, local oscillator 52 and 90 phase shifter 53. The output of the in phase and quadrature mixers is detected in a pair of square law detectors 54 and 55, the former associated with the in-phase or I component and the latter with the quadrature or Q component. The detected I and Q components may then be combined in adder 56 whereupon the the amplitude spectrum of the signal band is produced on output lead 60 of adder 56. The signal may then be digitized if desired in A/D converter 61, integrated by the shift register 62 and summer 67 and produces an output on lead 63 via a multiplexer 64 under the control of a readout control switch 65. The reconstructed analog signal may also be extracted prior to digital conversion via lead 66.

Alternate utilization of the I and Q components is accomplished while retaining the phase information by converting the output of I mixer 50 to digital form in A/D converter 70 and simultaneously converting the Q output of mixer 51 to similar form in A/D converter 71. The digitized I and Q components of any of the signals of interest within the signal band may then be introduced into respective channels of multiplexer 64 under the control of emitter selector switches 72 and 73 respectively, operated by the timing control circuit 26.

Emitter selector 72 is merely a frequency selector used when the input signal of antenna 20 contains a number of signals originating at different frequencies. Emitter-selectors 72,73 extract I and Q samples at times within each sweep corresponding to the center frequency at each desired emitter.

Figure 4:
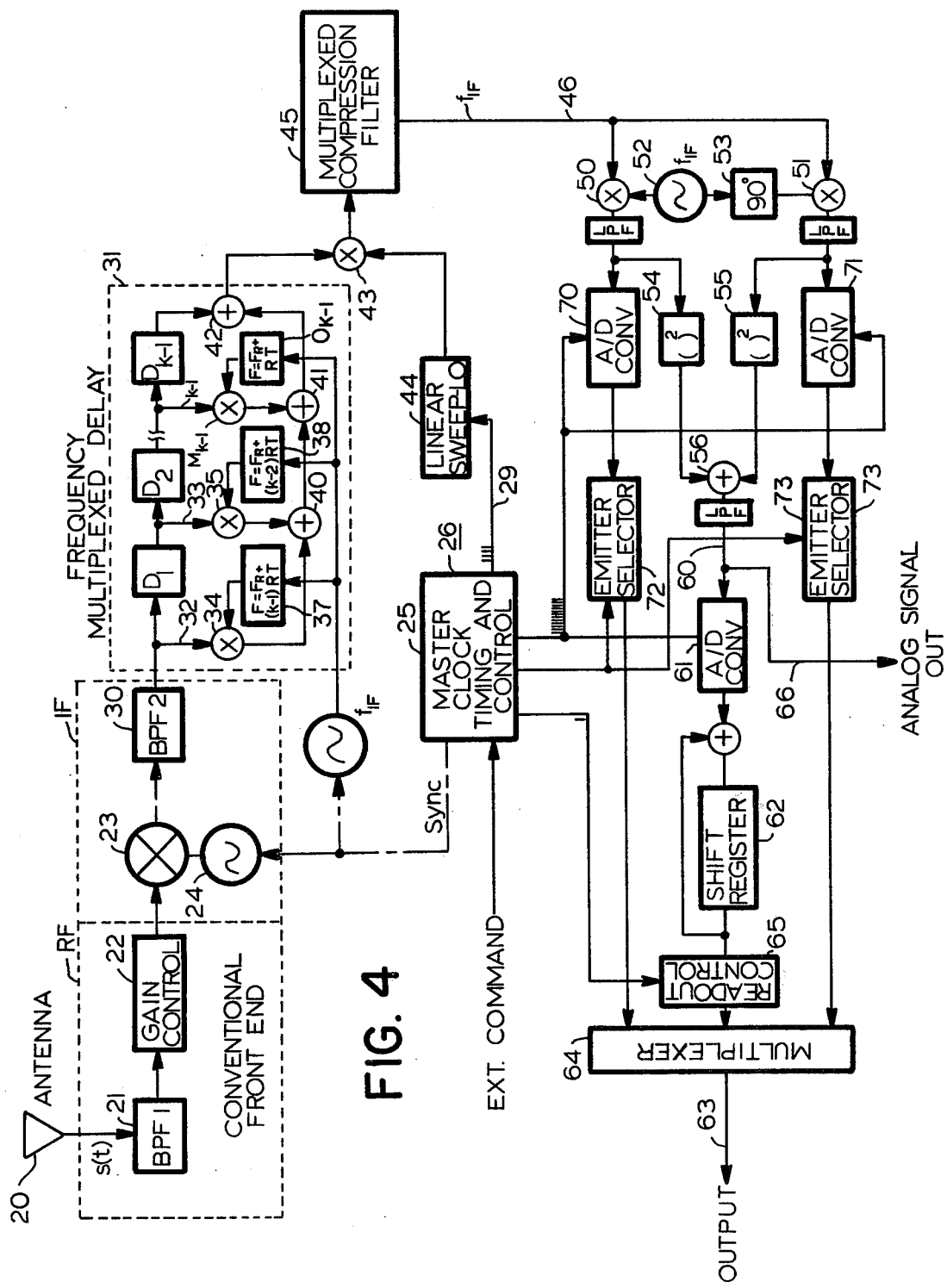
FIG. 4 is a block diagram of this invention.

In FIG. 4, the A/D converter 70,71 is shown operating at clock rate and the emitter selectors 72, 73 operated variable rate depending upon the control input from the Timing & Control Circuit 26 at any rate up to the clock rate. In general a few particular emitters will be the object of interest and the rate of pulses to emitter selectors 72 and 73 will correspond in number and in time location for each sweep related to the frequency of the emitters of interest.

An alternate approach is to just operate or trigger the A/D converters 70 and 71 at times corresponding to the wanted emitter locations. In such case the A/D converters 70 and 71 and emitter selectors 72 and 73 may be operated by a common control input.

Figure 5:
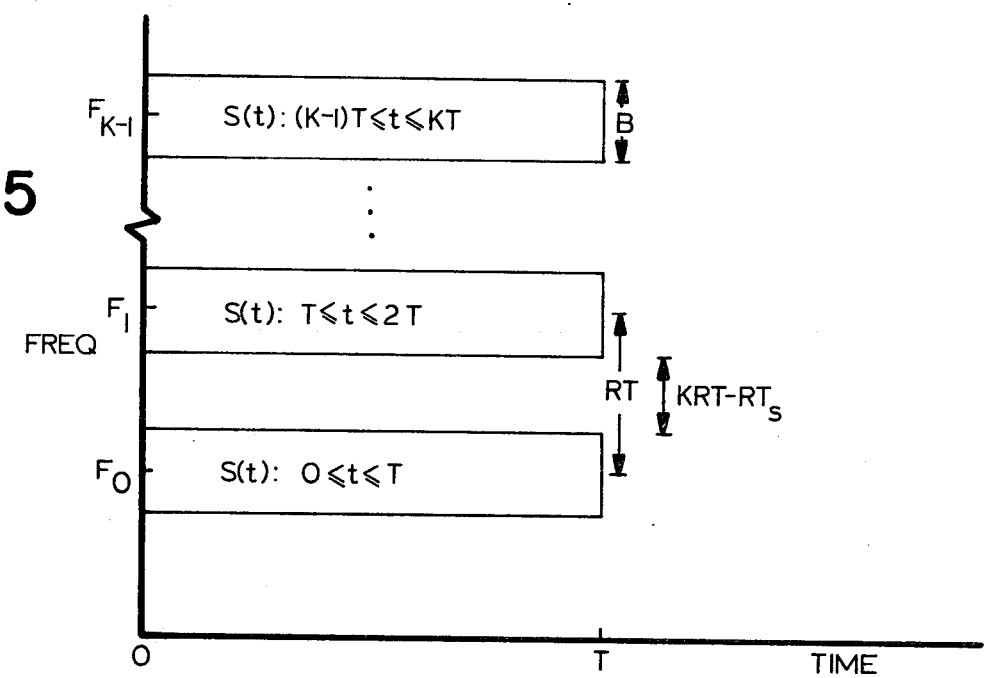
FIGS. 5 and 6 are graphical representations of the operating characteristics of this invention.

Employing this invention a plurality of signals are frequency multiplexed and accumulated in a time delay subsystem presenting a signal time window T as shown in FIG. 5. This figure illustrates that K segments of the input signal may be multiplexed so that KT seconds of signal may be accumulated in one T second period. Search for signals of interest in the band and channelization of signals for analysis, reproduction or retransmission may easily be accomplished by the single receiver in accordance with this invention while meeting the Nyquist sampling criteria.

THE MULTIPLEXED TIME DELAY SUBSYSTEM

Central to the unaliased channelization of signals located within the receiver bandwidth is the relationship between scan time $T_s$ (sampling period) and filter bandwidth $\Delta f$ (resolution). Specifically, $T_s < (1/\Delta f)$ for Nyquist or better sampling.

My Multichannel Coherent receiver creates an effective receiver time window for which $T_s < (1/\Delta f)$ through frequency multiplexed time delay circuit 31 as shown in FIG. 4. The input signal is routed to the delay line 31 and to a mixer 42 for up-conversion by RT Hz (R=chirp oscillator scan rate in Hz/sec, T=(1/k$\Delta f$). The delay line has (k−1) taps, the signal out of each tap delayed by T sec relative to the previous tap.

The total signal input to the chirp oscillator mixer 43 is the sum of the (k−1)T sec delayed input, the (k−2)T sec delayed input translated by RT Hz, and (k−3)T sec delayed input translated by 2RT Hz, and so on. This may be written as $$s_0(t) = s(t - (k - 1)T) \sin (\omega_{IF} t) + \qquad (8)$$

$$s(t - (k - 2)T) \sin (\omega_{IF} + 2\pi RT)t +$$

$$\ldots + s(t) \sin (\omega_{IF} + (k - 1)RT)t$$

Figure 10:
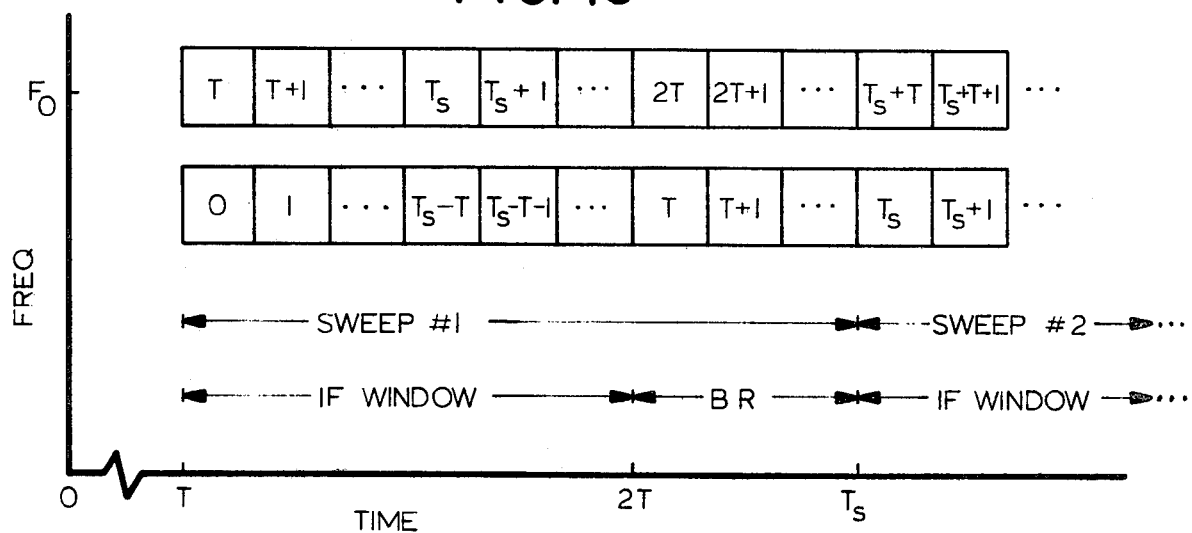

-continued $$= \sum_{n=1}^{k} s(t - (k - n)T) \sin(\omega_{IF} + (n - 1)2\pi RT)t$$

where s(t) is the input signal. If we observe the output for a period of T sec (after waiting at least (k−1)T sec for initiation) we see the situation shown in FIG. 10 (for k=2).

The output signal is a frequency multiplexed signal with the unique property that any T sec segment contains kT sec of the input signal (at a cost of increased bandwidth).

Figure 11:
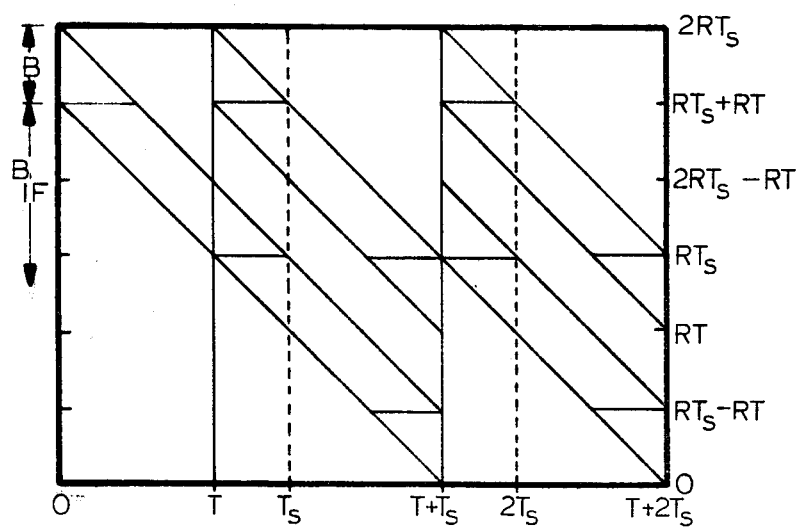

When input to the swept oscillator, the frequency versus time diagram shown in FIG. 11 is appropriate (for the k=2 case). Note that during each sweep time $T_s$ we have an effective 2T sec window. Thus, the eventual resolution is 1/2T Hz. The required sampling period for such a filter is $T_s < 2T$. (The general Nyquist requirement is $T_s < kT$). As long as T>s/k the Multichannel Coherent Receiver is able to achieve Nyquist (or faster) sampling.

Above we described the conventional compressive receiver and indicated that $T_s > T$. Here we point out that the conventional receiver may be interpreted as a special case of multichannel coherent receiver with k=1. However, for Nyquist sampling a necessary condition is $k \geq 2$.

The output of the swept oscillator 44 of FIG. 1 as shown in FIG. 11 is compressed by the second Multichannel Coherent receiver subsystem, the multiplexed compression filter 45.

MULTIPLEXED COMPRESSION FILTER

In order to form the Fourier transform of the input signal s(t), the swept output of the chirp oscillator mixer 43 must be processed by the appropriate matched filter. Such a filter is shown in FIG. 7. Perhaps the most straight-forward means of realizing this filter is the use of k separate dispersive delay lines, each at an appropriate center frequency as shown in FIG. 7. Another approach is to fabricate a single filter having the characteristics shown in FIG. 6. The broad utilization of the Multichannel Coherent receiver of this invention will undoubtedly call for the development of a single filter having the required characteristics.

We next derive the output of the matched filter 45. With reference to equation 8, let the output of the chirp oscillator 44 be $$c(t) = \left( \sum_{n=1}^{k} s(t - (k-n)T)e^{-j2\pi(n-1)RT(t-(k-1)T)} \right) e^{-j\pi R(t-(k-1)T)^2} \quad (9)$$

where we have used complex notation for convenience, and perform the analysis of baseband to further simplify the equations.

Recall that the frequency multiplexed delay line begins yielding valid output after an initial delay of (k−1)T sec;

$$c(t + (k-1)T) = \quad (10)$$

$$\left( \sum_{n=1}^{k} s(t + (n-1)T)e^{-j2\pi(n-1)RT(t+(k-1)T)} \right) e^{-j\pi Rt^2}.$$

The impulse response of the frequency multiplexed matched filter is given by $$h(t) = e^{-j2\pi(n-1)RT(t)}e^{+j\pi Rt^2} \quad n=1,2\ldots,k \quad (11)$$

So the output of the multiplexed filter 45 is $$y(\tau) = \int_0^T \sum_{n=1}^{k} s(t + (n-1)T)e^{-j2\pi(n-1)RTt} e^{-j\pi Rt^2} e^{j\pi R(\tau-t)^2} e^{-j2\pi(n-1)RT(\tau-t)} dt \quad (12)$$

$$= e^{j\pi R\tau^2} \sum_{n=1}^{k} e^{-j2\pi(n-1)RT\tau} \int_0^T s(t + (n-1)T)e^{-j2\pi R\tau t} dt.$$

Changing variables within the integral gives $$y(\tau) = \quad (13)$$

$$e^{j\pi R\tau^2} \sum_{n=1}^{k} e^{-j2\pi(n-1)RT\tau} \int_{(n-1)T}^{nT} s(\alpha)e^{-j2\pi R\tau(\alpha-(n-1)T)} d\alpha$$

$$= e^{j\pi R\tau^2} \sum_{n=1}^{k} \int_{(n-1)T}^{nT} s(\alpha)e^{-j2\pi R\tau\alpha} d\alpha$$

$$= \boxed{e^{j\pi R\tau^2} \int_0^{kT} s(\alpha)e^{-j2\pi R\tau\alpha} d\alpha}.$$

Equation 13 is a key result. It states that a T sec segment of the chirped output of the frequency multiplexed time delay circuit 31, when passed through the filter 45 shown in FIG. 7, is the Fourier transform of s(t) having a true time window of kT sec duration. Thus the resolution (or filter 4y bandwidth) is approximately 1/kT Hz.

The left term in equation 13 is an undesired residual FM (or chirp) modulating the desired transform. This may be removed in a straightforward manner by dechirping the matched filter 45 output. However, this may not be necessary if we restrict the Multichannel Coherent receiver to extraction of signals of interest having bandwidth on the order of or less than the channelization filter 45 bandwidth (1/KT) Hz.

Let s(t) be a signal of interest with bandwidth (1/KT) Hz. The Multichannel Coherent receiver output of interest for this signal will last $\Delta\tau$ sec, where $$\Delta\tau = (1/RkT), \quad (14)$$

for $\Delta\tau$ sec the residual FM frequency will be changed to $\Delta f$ Hz, where $$\Delta f = R\Delta\tau \quad (15)$$
$$= \frac{1}{KT}.$$

If the period of this maximum frequency is significantly larger than the duration of the desired output, then we may ignore the term. This condition is $$(1/\Delta f) >> \Delta\tau, \quad (16)$$

or $$(kRT)(kT) >> 1 \quad (17)$$

However, the above product is the equivalent time-bandwidth product (TW) of the frequency multiplexed matched filter 45. Thus, for large TW(>100) we may be able to ignore the residual FM term. We point out the gain ($k^2$) in TW achieved by the filter 45. This means that the individual TW products (if we use the k-parallel filter approach) may be relaxed by a factor of $k^2$ to achieve a given effective TW.

CHANNELIZATION

Each of the previous sections has discussed a particular subsystem of the receiver for the overall purpose of establishing the kT sec window and resulting k-times improvement in frequency resolution, and perhaps most importantly the attendant capability of Multichannel Coherent receiver to achieve Nyquist and greater sampling of 1/kT filters when $kT > T_s$.

Expanding upon the previous result, we may derive the Multichannel Coherent receiver output for a general bandpass intercept and arbitrary matched filter 45 center frequency. Using strictly real signals one may see how the I+Q mixer generates the real and imaginary parts of the input signal Fourier transform translated to baseband.

Figure 8:
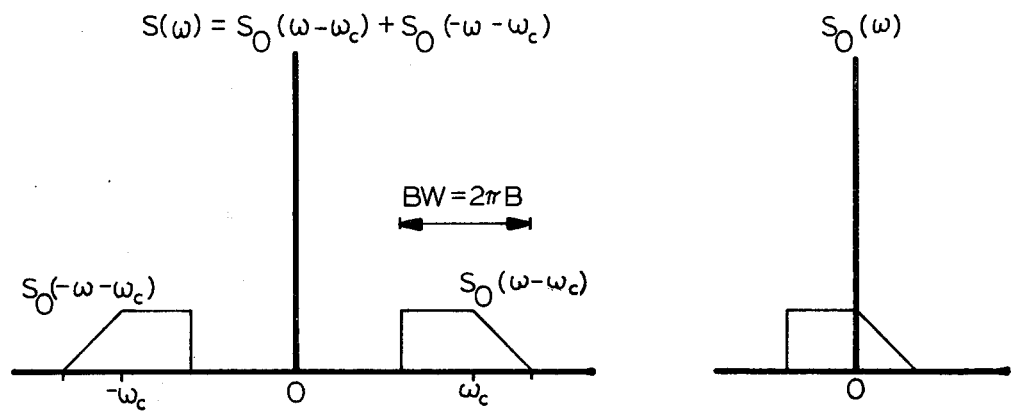
FIGS. 8-11 are additional graphical representations of the operating characteristics of this invention.

First, we use standard I+Q representation of an arbitrary bandpass signal s(t).

$$s(t) = s_p(t) \cos(\omega_c t) + s_q(t) \sin \omega_c t \quad (18)$$

where
$$= e(t) \cos(\omega_c t - \phi(t)),$$

where $$e(t) = 2\sqrt{s_p^2(t) + s_q^2(t)}, \quad (19)$$

and $$\phi(t) = \tan^{-1} \frac{s_q(t)}{s_p(t)},$$

as shown in FIG. 8.

We also show the spectrum of the baseband complex functions $s_o(t)$, where $$s_o(t) \overset{\Delta}{=} LPF\{s(t)e^{-j\omega_c t}\} \quad (20)$$
$$= e(t)e^{j\phi(t)},$$

where LPF {·} indicates passage through a low pass filter having two sided bandwidth B. The signal defined in equation 20 is now shown to be the in-phase and quadrature output of the Multichannel Coherent receiver I+Q mixer 56.

Using equation 18, the output of the chirp oscillator mixer 43 is:

$$c(t) = e(t) \cos(\omega_c t - \phi(t)) \cos(\omega_1 t - \pi R t^2) \quad (21)$$
$$= \tfrac{1}{2} e(t) \cos(\omega_{IF} t - \phi(t) + R t^2),$$

where we eliminate the sum frequency term, and $\omega_{IF} = \omega_c - \omega_1$.

The output of the matched filter 45 is then (dropping the multiplicative constants), $$y(R\tau) = \int_o^T c(t) \cos(-\omega_{IF}(\tau - t) + \pi R(\tau - t)^2) dt, \quad (22)$$

which becomes $$y(R\tau) = -\cos(\omega_{IF}\tau - \pi R\tau^2) \int_o^T e(t) \sin(\phi(t) - 2\pi R\tau t) dt + \quad (23)$$
$$\sin(\omega_{IF}\tau - \pi R\tau^2) \int_o^T e(t) \cos(\phi(t) - 2\pi R\tau t) dt.$$

We next pass the above signal through the in-phase ($\cos(\omega_{IF}\tau)$) and quadrature ($\sin(\omega_{IF}\tau)$) mixers 50 and 51 to get $$I\text{-channel: } - \int_o^T e(t) \sin(\phi(t) - 2\pi R\tau t) dt \quad (24)$$

$$Q\text{-channel: } \int_o^T e(t) \cos(\phi(t) - 2\pi R\tau t) dt$$

where, as discussed above, we have eliminated or ignored the residual FM. The I-channel output may be written, $$I\text{-channel: Imag}\left\{\int_o^T e(t)e^{j\phi(t)}e^{-j2\pi R\tau t} dt\right\} \quad (25)$$

and the Q-channel $$Q\text{-channel Real}\left\{\int_o^T e(t)e^{j\phi(t)}e^{-j2\pi R\tau t} dt\right\}. \quad (26)$$

Referring back to equation 20, we see that the I+Q mixers 50 and 51 outputs are the imaginary and real parts of the Fourier transform of the baseband signal $s_o(t)$. When this transform is sampled, once per scan, the resulting multiplexed compression receiver output is exactly the same as if a bandpass filter had been placed at $\omega_c$, and the output translated to baseband. This is the channelization property of the Multichannel Coherent receiver.

ALTERNATE EMBODIMENT

In the situation where the Multichannel Coherent Receiver of this invention is desired but the intermediate frequency bandwidth is limited or when $K/F_s < 2$, the modified receiver of FIG. 14 is to be used. This embodiment replaces the circuitry of FIG. 4 between the output of band pass filter 30 (BPF2) and lead 46, the output of the multiplexed compression filter 45.

Employing this alternate configuration the composite input signal from band pass filter 30 is introduced into a tapped delay 131 having a number of sections 131A——131N. The time delay between taps is T seconds. The individually delayed signals at the taps are each multiplied with a common swept local oscillator frequency from oscillator 44 in respective mixers 132–135, then introduced into identical (matched) respective dispersive filters 101–104. These outputs are then up converted in frequency by mixinb in respective mixers 108, 109 and 116 with the output of synchronized local oscillators 105–10n having frequencies related f=(k-1)RT, f=(k-2)RT and f=RT just as in the frequency multiplexed delay circuit 31 of FIG. 4. The signals are next summed in adder 111 ready for introduction into the in-phase and quadrature samplers of FIG. 4.

The advantages of the embodiment of FIG. 14 in the IF bandwidth limited situation are apparent. Employing the embodiment of FIG. 4, the entire IF band is carried in one signal channel, e.g. the lead between the bandpass filter 30 and the frequency multiplexed delay. This may exceed the capabilities of the existing components capabilities in bandwidth. Likewise, each band as illustrated in FIG. 5 must be separated by a dead band so the bandwidth B is limited.

Employing the alternate embodiment of FIG. 14, each delayed segment is carried on a separate lead, through a separate mixer 132–135 and thus are isolated from each other until recombined in adder 111. The individual bands are smaller in bandwidth than the single band of FIG. 4 and the individual bands may overlap.

FIG. 14 shows only N-1 mixers 108–110 when operating at the IF frequency,—the simplest case from the equipment standpoint. All output lines from the dispersive filters 101-104 will have a respective mixer if it is desired to produce the output at a different IF.

TIMING AND CONTROL

Timing is accomplished employing the master clock and timing control circuit 26 of FIG. 4. A typical circuit 26 is illustrated in FIG. 13 and its output wave forms illustrated in FIG. 12.

Referring now to FIG. 13, the timing and clock circuit comprises basically a master clock, oscillator 25 which provides the basic clock rate for the system. It's clock rate is chosen arbitrarily. Master clock 25 provides clock frequency on lead 27 to the Analog to Digital converters 61, 70 and 71. The basic clock frequency $F_o$ is divided in divide by 1000 prox. in divider circuit 28 to produce a trigger pulse on lead to trigger each sweep of oscillator 44.

The timing and control circuit also includes a counter 37, digital memory 38 and comparator 39. Pulses from the master clock 25 are introduced into the counter 37 and the counter is reset each time the local oscillator 44 is triggered. Thus the frequency position of a signal is related to the count in the counter 37. The external command applied to the digital memory 38 establishes a count which is the equivalent of the frequency or emitter desired to be processed. This count is introduced into a comparator 39 so that each time coincidence exists in counter 38, comparator 39 provides enabling pulses to the emitter selectors 72, 73, which merely are switches to allow the passage of signals when they are enabled.

MULTICHANNEL COHERENT RECEIVER SPECTRUM ANALYSIS

When used as an improved resolution spectrum analyzer, the Multichannel Coherent receiver output given in equation 23 is simply envelope detected as illustrated in FIG. 4. Thus, we square and add the I+Q mixer outputs given in equation 24 to obtain $$I^2(R\tau) + Q^2(R\tau) = A^2(R\tau) \sin^2(\psi(R\tau)) + A^2(R\tau) \cos^2(\psi(R\tau)) \quad (27)$$

$$= A^2(R\tau)$$

which is the magnitude of the desired spectrum, where $$A(R\tau)e^{j\psi(R\tau)} \stackrel{\Delta}{=} \int_o^T e(t)e^{j\phi(t)}e^{-j2\pi R\tau t}dt. \quad (28)$$

MULTICHANNEL COHERENT RECEIVER PARAMETER RELATIONSHIPS

When employing the Multichannel Coherent receiver, there are a number of parameters that must be chosen to specify a given Multichannel Coherent receiver performance. We list below the parameters most frequently encountered.

| INDEPENDENT MULTICHANNEL COHERENT RECEIVER PARAMETERS | |
|---|---|
| Receiver Parameter | Definition |
| B | Intercept Bandwidth (Hz) |
| ΔF | Frequency resolution or channelization filter bandwidth (Hz) |
| k | Number of multiplexed time windows; improvement in frequency resolution over conventional receivers; number of taps on delay line. |
| $F_s$ | MCR sampling rate relative to Nyquist ($F_s \geq 1$ for channelization). |

Once the above parameters are independently specified, the following parameters are determined.

| DEPENDANT MULTICHANNEL COHERENT RECEIVER PARAMETERS | | |
|---|---|---|
| Parameter | Value | Definition |
| T | $\dfrac{1}{k\Delta f}$ | Time delay between delay line taps (sec). |
| $T_s$ | $\dfrac{1}{F_s \Delta f}$ | MCR scan time (sec). |
| TW | $\dfrac{B}{k\Delta f(\frac{k}{F_s} - 1)}$ | Time-bandwidth product of each multiplexed dispersive delay line |
| R | $\dfrac{Bk\Delta f}{(\frac{k}{F_s} - 1)}$ | MCR scan rate (Hz/sec.) |
| $B_{IF}$ | $\dfrac{B}{(\frac{k}{F_s} - 1)}$ | Bandwidth of each multiplexed dispersive delay line (Hz). |
| $B_{OUT}$ | $\dfrac{kB}{(\frac{k}{F_s} - 1)}$ | MCR output bandwidth in the spectrum analyzer mode (Hz). |

Obviously the above partition into independent and dependent variables is arbitrary, but I have found that a typical design sequence begins with at least a rough knowledge of the desired intercept bandwidth and resolution, and that the sampling rate should be at least 1.25 to 2 times Nyquist ($1.25 < F_s < 2.0$)

Figure 9:
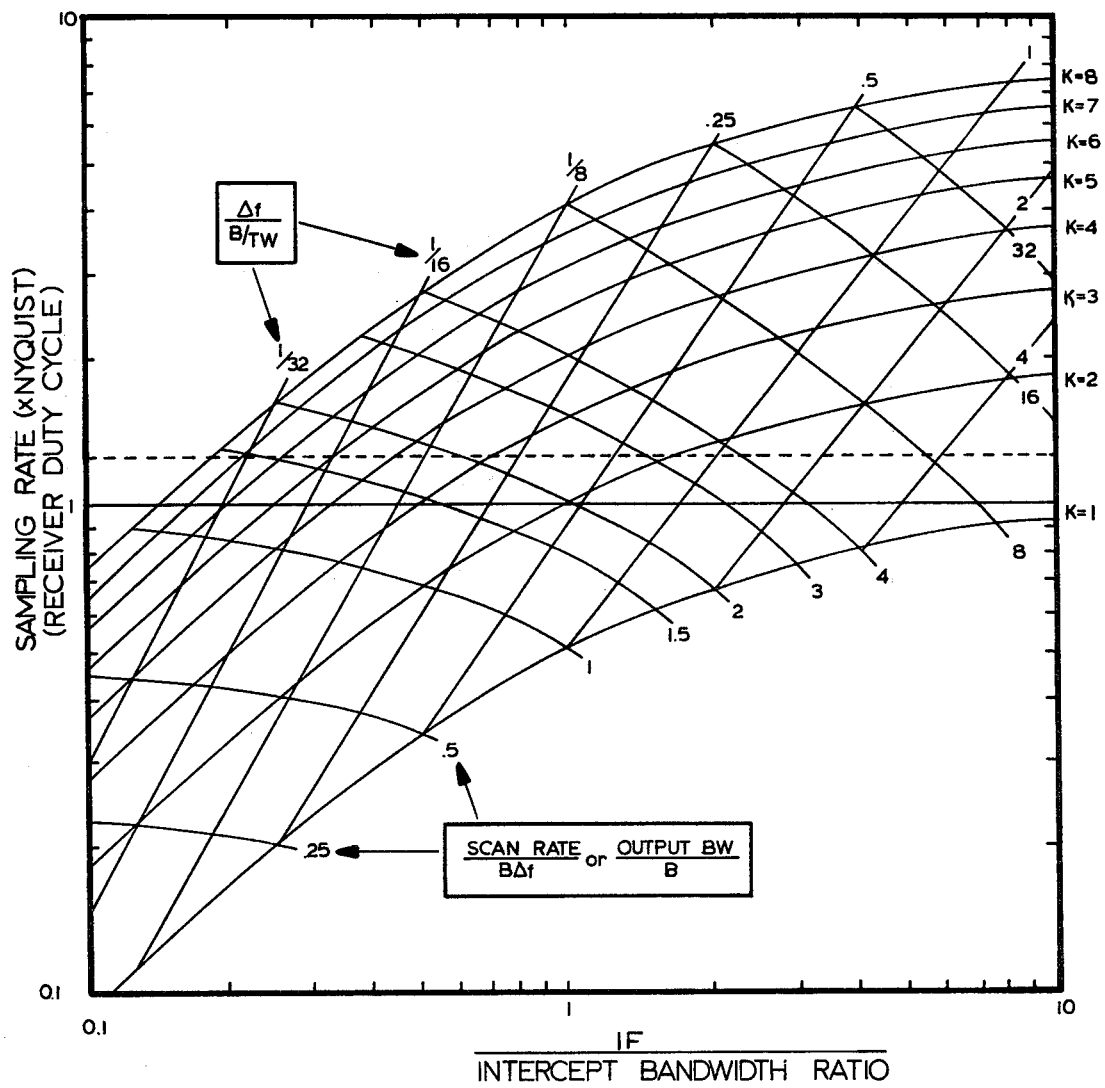

FIG. 9 shows the functional relationships between all of the above parameters, and how one may be traded against another. As an example of the utility of the chart suppose that the following multichannel coherent receiver characteristics are desired.

| TYPICAL EXAMPLE MULTICHANNEL COHERENT RECEIVER PARAMETERS | |
|---|---|
| Parameter | Value |
| B | 30 Mhz |

-continued

TYPICAL EXAMPLE MULTICHANNEL COHERENT RECEIVER PARAMETERS

| Parameter | Value |
|---|---|
| $\Delta F$ | 10 KHz |
| $F_s$ | 2 |
| k | 4 |

Referring to FIG. 9, the intersection of the $F_s=2$ and $k=4$ curves is the resulting Multichannel Coherent receiver operating point. Moving vertically down to the abscissa, one can see that the required bandwidth per multiplexed dispersive delay line is $1 \times 30$ MHz=30 MHz. The negatively sloped curve through the operating point indicates that the output bandwidth for the spectrum analyzer mode is $4 \times 30$ MHz=120 MHz, and that the required scan rate is $30 \times 10^6 \times 10^4 \times 4 = 1.2$ MHz/usec. The positively sloped curve through the operating point states that the required time-bandwidth product for each of the four multiplexed dispersive delay lines if $$\frac{30 \times 10^6}{10^4} (\tfrac{1}{4}) = 750.$$

Now say the output bandwidth of 120 MHz in the multiplexed compression receiver spectrum analyzer mode is considered too large, but the intercept bandwidth, frequency resolution, and time-bandwidth product must remain the same. One may than stay on the $(\Delta f/B/TW)=\tfrac{1}{4}$ curve and move to the lower left to reduce the output bandwidth (at a cost of reduced sampling rate, in this example).

It is also pointed out that the $k=1$ curve is the locus of operating points for conventional compressive receivers, as defined above. Note that the curve only asymptotically approaches $F_s=1$ (or Nyquist sampling), as the IF bandwidth increased to infinity, or the intercept bandwidth decreases to zero.

Although specifically designed to achieve coherent channelization of signals of interest, the Multichannel Coherent Receiver of this invention also provides significant advantages when applied to spectrum analysis and/or signal search.

In this section we characterize the Multichannel Coherent receiver as an instantaneous frequency measurement (IFM) receiver, and compare its performance to the conventional receiver described above.

All of the receiver parameters defined above are, of course, still appropriate, but here we focus on the $F_s \leq 1$ region. In addition, we define the following generic design parameters for IFM receivers.

MCR/IFM RECEIVER PARAMETERS

| Parameter | Definition | Value | Comment |
|---|---|---|---|
| Relative Compression Factor | $\dfrac{B/\Delta f}{TW}$ | $k(\dfrac{k}{F_s} - 1)$ | Numerator is number of frequency resolution cells, denomenator is dispersive filter time-bandwidth product. Measure of efficient use of TW. |
| Relative Output Bandwidth | $\dfrac{B_o}{B}$ | $\dfrac{k}{\dfrac{k}{F_s} - 1}$ | Ratio of receiver output-to-input bandwidth. |
| MCR Compression Gain | $\dfrac{B/\Delta f}{TW}\bigg\|(MCR)$ $\dfrac{B/\Delta f}{TW}\bigg\|(\text{conventional})$ | $\dfrac{k(k - F_s)}{1 - F_s}$ | Measure of increased MCR resolution for same TW, or reduced TW for same resolution. |
| Probality of Intercept (Receiver duty cycle) | $F_s$ | $0 < F_s < 1$ | Same as defined above but emphasis on $F_s < 1$. |

Figure 15:
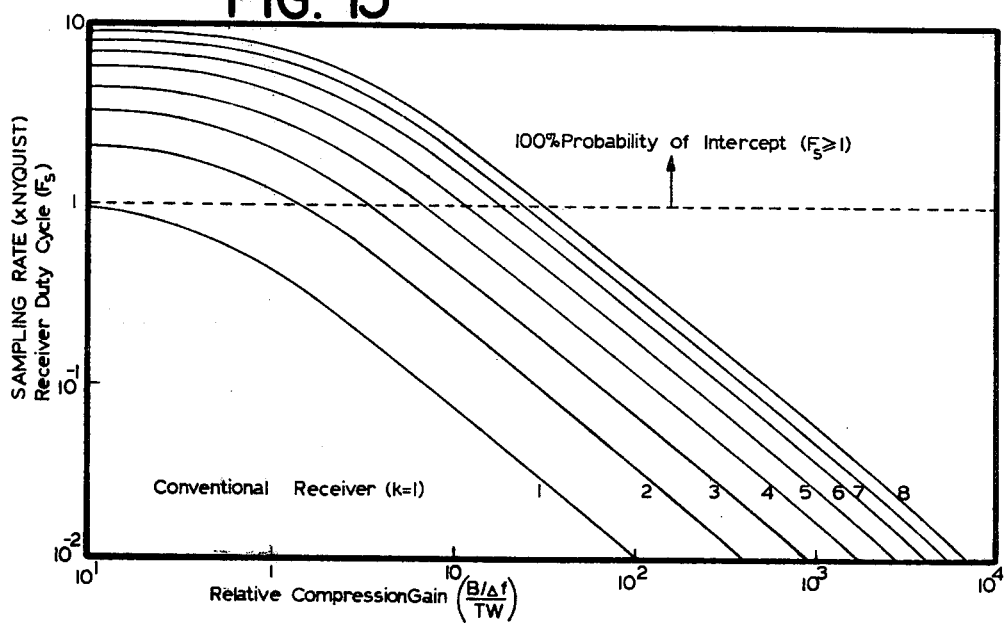
FIGS. 15-17 are graphical representations of the performance of this invention as compared with prior art receivers.

FIG. 15 shows the relationship between relative compression factor and receiver duty cycle (POI). The curves point out the trade required between POI and compression factor—higher POI always demand more time bandwidth product (TM) for the dispersive filter 31, reduced resolution, or both. The Multichannel Coherent receiver configured with four ($k=4$) multiplexed time delays improves the situation by achieving higher POI for a given compression factor, or higher resolution (or lower TW) for a given POI. For example, the Multichannel Coherent receiver with $k=4$ realizes a factor of 30 increase in resolution for the same time bandwidth product (TW) and POI (50%) when compared to the conventional receiver. This relative improvement is shown parametrically in FIG. 16 as a function of receiver duty cycle. The compression gain may be interpreted as the increase in resolution (or reduction in TW) for Multichannel Coherent receiver relative to conventional (IFM) Instantaneous Frequency Measurement receivers. At low duty cycles, the Multichannel Coherent receiver compression gain approaches its minimum of $k^2$. For higher values of $F_s$ the gain becomes quite large, being approximately 30 for $k=4$ and $F_s=0.5$.

Figure 17:
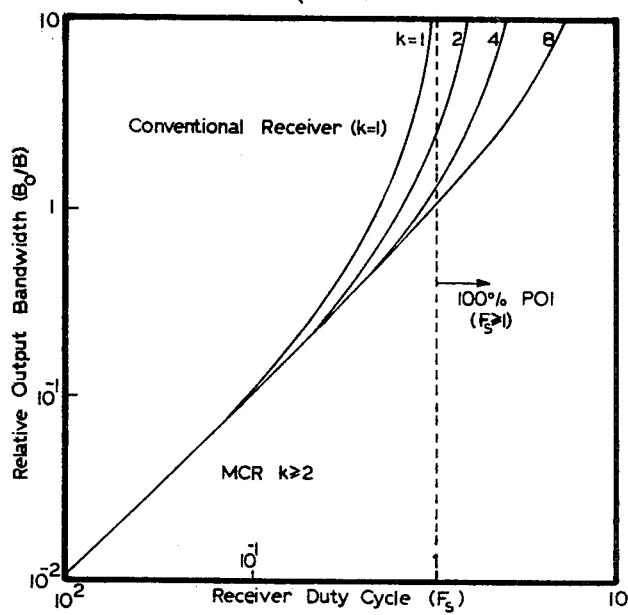

Output bandwidth is an important consideration in the selection of Instantaneous Frequency Measurement parameters, and often prevents the realization of desired POI and/or resolution. In FIG. 17 we show the relationship between POI and relative output bandwidth ($B_o/B$). Note that the Multichannel Coherent Receiver achieves essentially the same output bandwidth as conventional receivers for low POI, and actually reduces the output bandwidth at high ($>0.1$) POI. When viewed in light of the previous two figures, this means significantly improved resolution with no increase in output bandwidth (for POI=50% and $k=4$ the bandwidth is reduced by more than a factor of 2, while the resolution is increased by a factor of 30 for the same Time Bandwidth Product).

Figure 16:
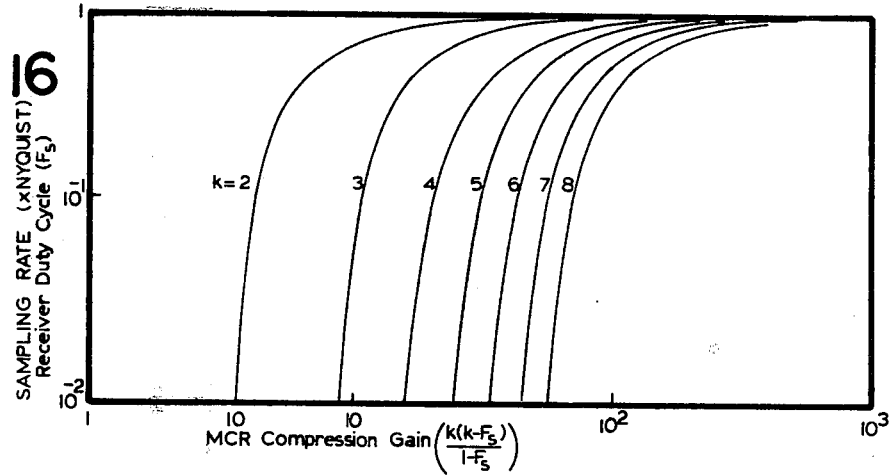

The three curves, FIGS. 15-17, should allow the reader to perform comparative traces between Multichannel Coherent Receiver and conventional Instantaneous Frequency Measurement receivers, regardless of the particular bandwidth, resolution, etc. required by each application.

The Multichannel Coherent Receiver has been shown to achieve significant improvement in resolution, POI, and required Time Bandwidth Product (TW). At the same time, the Multichannel Coherent Receiver is capable of operating as a coherent channelization receiver. This combination of efficient signal search and coherent extraction of Signal of Interest (SOI) can provide an attractive receiver for the signal collection problem.

What is claimed is:

1. A radio receiver comprising an input circuit for receiving a radio signal;

a local oscillator;

means for mixing a radio signal at said input circuit with at least one local oscillator frequency to produce a convenient intermediate frequency product of said radio signal and said local oscillator frequency;

a variable frequency oscillator generator having a predetermined scan rate;

a delay line including a plurality of taps;

means for introducing the intermediate frequency product of said mixing means into said tapped delay line;

a respective oscillator for each of said taps, each of said oscillators having a frequency which is a function of $(k-n)RT$ where $K-1$ is the number of taps, R is the scan rate of the variable frequency oscillator generator, T is a constant and n is the number of a particular tap;

means for mixing the output of each of said taps with the output of its respective oscillator to provide a plurality of outputs;

means for combining the plurality of outputs to produce frequency multiplexed delayed products;

means for mixing the output of said variable frequency oscillation generator with the output of said combining means;

a filter having a variable delay-frequency characteristic matched to the time variation rate of said variable frequency oscillation generator coupled to the output of said last mixing means and having a maximum delay value T; and means connected to the output of said filter for utilizing the signal whereon;

whereby said receiver develops a Fourier transformation of input signals with amplitude and phase information preserved.

2. A signal analyzer comprising:

a variable frequency oscillation generator having a predetermined scan rate;

a delay line including a plurality of taps;

means for introducing a signal to be analyzed into said tapped delay line;

a respective oscillator for each of said taps, each of said oscillators having a frequency which is a function of $(k-n)RT$ $K-1$ is the number of taps, R is the scan rate of the variable frequency oscillation generator, T is a constant and n is the number of a particular tap;

means for mixing the output of each of said taps with the output of its respective oscillator to provide a plurality of outputs;

means for combining the outputs of said mixing means to produce frequency multiplexed delayed products;

means for mixing the output of said variable frequency oscillation generator with the output of said combining means;

a filter having a variable delay-frequency characteristic matched to the time variation rate of said variable frequency oscillation generator coupled to the output of said last mixing means and having a maximum delay value T; and means connected to the output of said filter for utilizing the signal whereon;

whereby said receiver develops a Fourier transformation of input signals with amplitude and phase information preserved and one hundred percent input signal coverage.

3. The combination in accordance with claim 1 or 2 wherein said filter has a plurality of linear time frequency sections.

4. The combination in accordance with claim 3 wherein each of the frequencies of said sections are central about the center frequency of the product from said combining means.

5. the combination in accordance with claim 1 or 2 wherein said combining means is an adder.

6. The combination in accordance with claim 1 or 2 wherein said variable frequency oscillation generator is a linear sweep local oscillator.

7. The combination in accordance with claim 1 or 2 including means for triggering said variable frequency oscillation generation once each sweep period.

8. The combination in accordance with claim 1 including first and second means coupled to output of said filter for deriving quadrature components of the signal output of said filter.

9. The combination in accordance with claim 2 including first and second means coupled to the output of said filter for deriving quadrature components of the signal output of said filter.

10. The combination in accordance with claim 8 or 9 including a pair of square law detectors coupled to respective quadrature component deriving means for detecting two othogonal components of signals; and means for adding said detected components to reconstruct the time amplitude spectrum of the signal band at the input of the receiver.

11. The combination in accordance with claim 8 including means for detecting the outputs of said first and second quadrature component deriving means;

means for adding the output of said detecting means to produce a reconstruction of analog signals received.

12. The combination in accordance with claim 8 in which said utilizing means comprises first and second analog to digital converters coupled to the outputs of respective quadrature component deriving means;

switch means coupled to the output of said analog to digital converters; and timing means coupled to said variable frequency oscillation generator to trigger its frequency variation and coupled to said switch means to switch said switching means to a conducting condition at a time related to a selected frequency of said variable oscillation generator.

13. The combination in accordance with claim 9 in which said utilizing means comprises first and second analog to digital converters coupled to the output of respective quadrature component deriving means;

switch means coupled to the output of said analog to digital converters; and timing means coupled to said variable frequency oscillation generator to trigger its frequency variation and coupled to said switch means to switch said switching means to a conducting condition at a time related to a selected frequency of said variable frequency oscillation generator.

14. The combination in accordance with claim 12 or 13 including individual switch means for each of said quadrature component deriving means.

15. The combination in accordance with claim 12 wherein said variable frequency oscillation generator is a linear sweeping oscillator and said timing means enables said switch means at a time after commencement of sweeping of said linear sweeping oscillator related to the desired frequency to be processed.

16. The combination in accordance with claim 8 wherein said utilization means comprises a pair of signal detectors respectively coupled to said quadrature component deriving means, and means for combining the outputs of said detectors.

17. The combination in accordance with claim 16 wherein said combining means is an adder.

18. A signal receiver comprising an input circuit for receiving a radio signal;

means for mixing a radio signal at said input circuit with at least one frequency to produce at least one intermediate frequency product of said radio signal and said frequency;

a delay line including a plurality of taps;

means for introducing said intermediate frequency product into said tapped delay line;

a variable frequency oscillation generator having a predetermined scan rate;

a plurality of frequency sources having a frequency relationship of $RT_1$ $2RT$ ———(K-1) RT where K-1 equals the number of taps of said tapped delay line, R is the scan rate of the variable frequency oscillation generator, T is a constant;

means for combining the output of the taps of said delay line with the output of respective frequency sources to produce frequency multiplexed delay products;

means for mixing the output of said variable frequency oscillation generator with the output of said combining means;

a filter having a delay which varies directly as a function of frequency of said last mixing means; and means for deriving quadrature components of the output of said filter.

19. A signal receiver comprising an input circuit for receiving a radio signal;

first means for mixing a radio signal a said input circuit with at least one frequency to produce at least one intermediate frequency product of said radio signal and said frequency;

a sweeping frequency oscillator;

a delay line including a plurality of taps;

means for introducing said product into said tapped delay line;

a plurality of frequency sources having a frequency relationship with respect to each other of RT, 2RT———(K-1) RT;

second means for mixing the output of the taps of said delay line with the output of respective frequency sources to produce a plurality of outputs means for combining the plurality of outputs to produce frequency multiplexed delay products;

third of said sweeping frequency oscillator with the output of said combining means;

a bank of dispersive filters, each of said bank of filters having a center frequency which is a function of the frequency of a respective one of said frequency sources as transformed by said sweeping oscillator and said third mixing means and having a bandwidth of at least RTHz;

said bank of dispersive filters coupled to the output of said third mixing means;

wherein K-1 equals the number of taps of said tapped delay line, R is the scan rate of the sweeping frequency oscillator, T is the maximum delay of said filters; and means for deriving the in phase and quadrature components of the output of said filter.

20. A signal receiver comprising:

means for receiving a signal;

a first local oscillator;

a mixer coupled to said signal receiving means and said first local oscillator to produce a first intermediate frequency representation of the signal received;

a sweeping frequency local oscillator;

a tapped delay line;

means for introducing said intermediate frequency representation of the signal into said tapped delay line;

means for mixing the signal at each of said taps with the output of said sweeping frequency local oscillator to produce a plurality of variable delayed representations of said signal;

a plurality of dispersive delay lines, each having a frequency-delay characteristic corresponding to the sweep rate of said sweeping frequency local oscillator;

means introducing said plurality of variable delayed representations of said signal into respective dispersive delay lines;

a plurality of second local oscillators each having a frequency a function (K-n) where K-1 is the number of taps, n is the number of a particular tap, R is the scan rate of the sweeping frequency local oscillator and T is a maximum delay of said dispersive delay lines;

a plurality of mixers for respectively combining the output of said second local oscillators with the output of respective dispersive delay lines; and means for adding the output of said mixers.

21. A signal analyzer comprising:

means for receiving a signal to be analyzed;

a sweeping frequency oscillator;

a tapped delay line;

means for introducing said signal to be analyzed into said tapped delay line;

means for mixing the signal at each of said taps with the output of said sweeping frequency oscillator to produce a plurality of variable delayed representations of said signal;

a plurality of dispersive delay lines, each having a frequency-delay characteristic corresponding to the sweep rate of said sweeping frequency oscillator;

means introducing said plurality of variable delayed representations of said signal into respective dispersive delay lines;

a plurality of second oscillators each having a frequency a function $F=(K-n)$ where $K-1$ is the number of taps, n is the number of a particular tap, R is the scan rate of the sweeping frequency local oscillator and T is maximum delay of said dispersive delay lines;

a plurality of mixers for respectively combining the output of said second oscillators with the output of respective dispersive delay lines; and means for adding the output of said mixers.

* * * * *